(12) United States Patent
Chiang et al.

(10) Patent No.: US 8,489,035 B2
(45) Date of Patent: Jul. 16, 2013

(54) RADIO COMMUNICATION TRANSCEIVER

(75) Inventors: Ming Chou Chiang, Shinchu (TW); Hsin Chieh Huang, Shinchu (TW)

(73) Assignee: ISSC Technologies Corp., Shinchu (TW)

( * ) Notice: Subject to any disclaimer, the term of this patent is extended or adjusted under 35 U.S.C. 154(b) by 438 days.

(21) Appl. No.: 12/892,705

(22) Filed: Sep. 28, 2010

(65) Prior Publication Data

US 2011/0281531 A1 Nov. 17, 2011

(30) Foreign Application Priority Data

May 14, 2010 (TW) .............................. 99115537 A

(51) Int. Cl.
*H04B 1/44* (2006.01)
(52) U.S. Cl.
USPC .............. 455/78; 455/75; 455/83; 455/232.1; 455/279.1; 455/333; 455/341; 330/10; 330/260; 343/822; 343/859
(58) Field of Classification Search
USPC ................. 455/78, 75, 83, 232.1, 279.1, 333, 455/341; 343/859, 822; 330/10, 260
See application file for complete search history.

(56) References Cited

U.S. PATENT DOCUMENTS

| | | | | |
|---|---|---|---|---|
| 6,809,581 B2 * | 10/2004 | Rofougaran et al. | ......... | 327/563 |
| 6,919,858 B2 * | 7/2005 | Rofougaran | .................. | 343/850 |
| 7,209,727 B2 * | 4/2007 | Castaneda et al. | ............ | 455/341 |
| 7,218,909 B2 * | 5/2007 | Rofougaran et al. | ......... | 455/333 |
| 7,369,096 B2 * | 5/2008 | Castaneda et al. | ............ | 343/859 |
| 7,526,256 B2 * | 4/2009 | Bhatti et al. | .................... | 455/73 |
| 7,538,741 B2 * | 5/2009 | Castaneda et al. | ............ | 343/859 |
| 7,899,409 B2 * | 3/2011 | Huang et al. | .................... | 455/78 |
| 8,229,367 B2 * | 7/2012 | Chan et al. | ....................... | 455/78 |
| 2004/0253939 A1 | 12/2004 | Castaneda et al. | | |
| 2007/0152904 A1 | 7/2007 | Castaneda et al. | | |

OTHER PUBLICATIONS

Knopik, Vincent , et al., 0.18 um Thin Oxide CMOS Transceiver Front-End with Integrated Tx/Rx Commutator for Low Cost Bluetooth Solutions, STMicroelectronics—Central R&D, pp. 1-4, Crolles, France.
Gan, Haitao , et al., Integrated Transformer Baluns for RF Low Noise and Power Amplifiers, 2007, pp. 1-4, Electrical Engineering Dept., Stanford University, Stanford, CA.
Marholev, B., et al., A Single-Chip Bluetooth EDR Device in 0.13um CMOS, 2007 IEEE International Solid-State Circuits Conference, pp. 1-3.

* cited by examiner

*Primary Examiner* — Marceau Milord
(74) *Attorney, Agent, or Firm* — Morris Manning & Martin LLP; Tim Tingkang Xia, Esq.

(57) ABSTRACT

A radio communication transceiver includes a transformer, a switch, a power amplifier (AP), and a low noise amplifier (LNA). The transformer has a primary winding and a center-tap secondary winding, the primary winding has a first endpoint and a second endpoint, and the center-tap secondary winding has a first endpoint, a second endpoint, and a third endpoint. The switch has a gate, a drain, and a source, in which the gate receives a control signal (CS), the drain is connected to the second endpoint of the primary winding of the transformer through a coupling capacitor, and the source is grounded. The PA has at least one output terminal connected to the first endpoint and the second endpoint of the center-tap secondary winding of the transformer. The LNA has an input terminal connected to the second endpoint of the primary winding of the transformer.

10 Claims, 3 Drawing Sheets

RADIO COMMUNICATION TRANSCEIVER

CROSS-REFERENCE TO RELATED APPLICATIONS

This non-provisional application claims priority under 35 U.S.C. §119(a) on Patent Application No(s). 099115537 filed in Taiwan, R.O.C. on May 14, 2010, the entire contents of which are hereby incorporated by reference.

BACKGROUND OF THE INVENTION

1. Field of Invention

The present invention relates to a radio communication transceiver, and more particularly to an impedance matching circuit used for the radio communication transceiver.

2. Related Art

When a radio communication transceiver is applied, impedance matching between the transceiver and an antenna needs to be taken into consideration. In the radio communication transceiver of the prior art, a used amplifier is in a dual-end transmitting manner, which relatively increases energy consumption, and also increases cost consumption.

For example, in the US application with the public No. 2007/0152904 A1 and entitled "IMPEDANCE MATCHED PASSIVE RADIO FREQUENCY TRANSMIT/RECEIVE SWITCH", ratio turns in a selected balun transformer is utilized, and is used together with a primary winding connected to an antenna and with a power amplifier (PA) and a low noise amplifier (LNA) in dual-end transmitting connected to a secondary winding, which results in the impedance matching for the antenna at the time of outputting and inputting respectively.

Further for example, in the US application with the public No. US 2004/0253939A1 and entitled "INTEGRATED CIRCUIT RADIO FRONT-END ARCHITECTURE AND APPLICATIONS THEREOF", a multi-tap balun transformer consisting of a primary winding and a symmetrical multi-tap secondary winding is utilized, and an input matching circuit is added between the primary winding and an antenna, a PA and an LNA in dual-end transmitting of which are connected to a first pair and a second pair of the symmetrical multi-tap secondary winding respectively. By switching a mode of the multi-tap balun transformer, impedance matching for the antenna at the time of outputting and inputting is achieved respectively.

However, both of the foregoing applications are used together with the amplifiers in the dual-end transmitting manner, which relatively increases energy and loss consumption. Hence, it is expected to invent a radio communication transceiver, in which a single transformer is used together with an LNA in single end transmitting manner, so as to reduce energy consumption, and achieve impedance matching simultaneously without any additional elements, thus decreasing the cost.

SUMMARY OF THE INVENTION

Accordingly, the present invention is a radio communication transceiver. The transceiver comprises a transformer, a switch, a PA, and an LNA. The transformer has a primary winding and a center-tap secondary winding, the primary winding has a first endpoint and a second endpoint, and the center-tap secondary winding has a first endpoint, a second endpoint, and a third endpoint. The switch has a gate, a drain, and a source, in which the gate receives a control signal (CS), the drain is connected to the second endpoint of the primary winding of the transformer through a coupling capacitor, and the source is grounded. The PA has at least one output terminal connected to the first endpoint and the second endpoint of the center-tap secondary winding of the transformer. The LNA has an input terminal connected to the second endpoint of the primary winding of the transformer. The switch enables the radio communication transceiver to receive a signal through an antenna and transmit the signal to the LNA corresponding to a first potential of the CS, and enables the signal to be emitted by the antenna through the PA corresponding to a second potential of the CS.

In the following embodiments, how to utilize OFF and ON state of the switch to achieve impedance matching is described respectively for both a receiving state and an emitting state of the radio communication transceiver.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

Hereinafter, describing preferable embodiments in detail aims at illustrating the present invention, while does not limit detailed description of the present invention.

Figure 1:
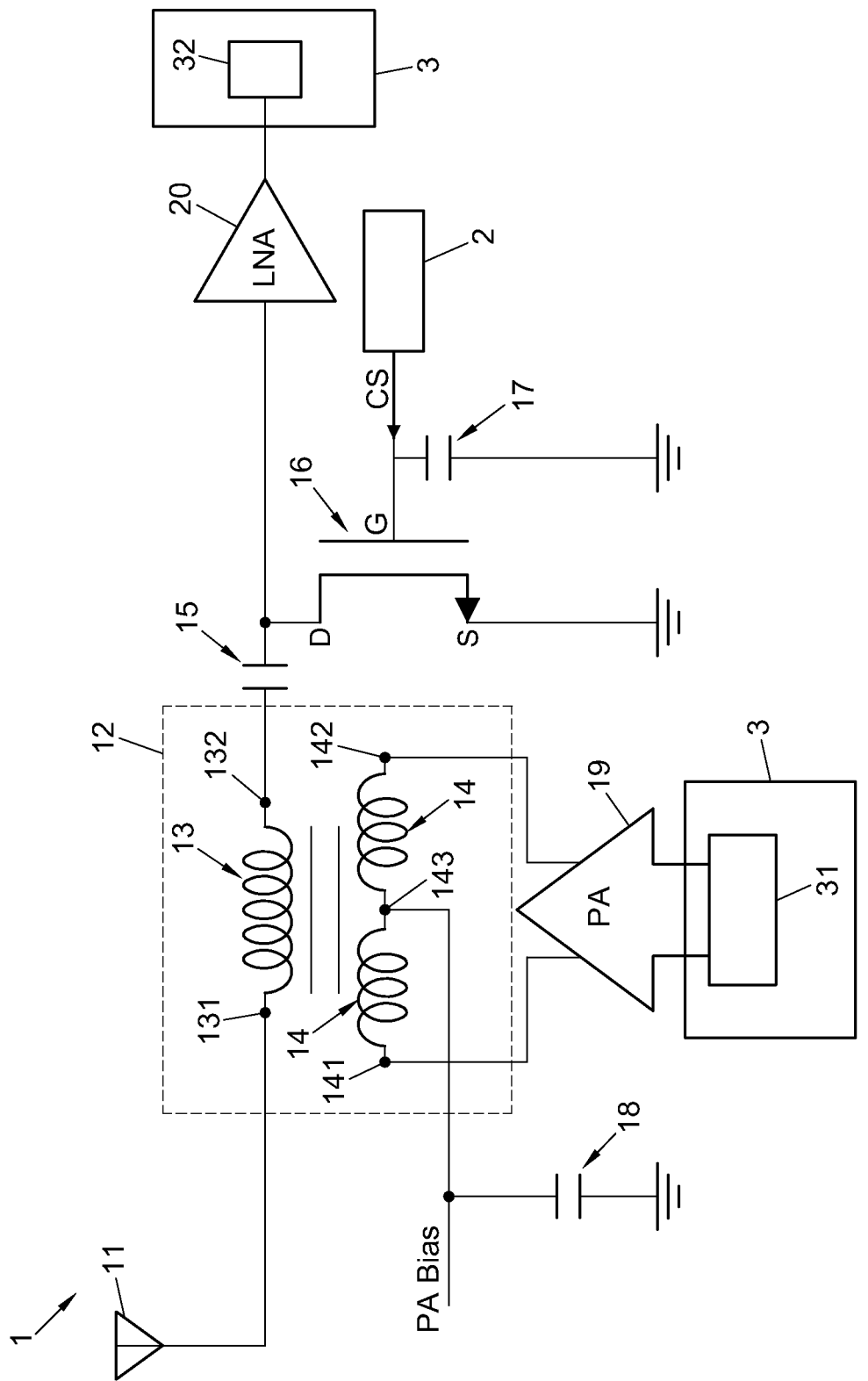
FIG. 1 is a schematic view of a radio communication transceiver 1 according to an example of the present invention.

FIG. 1 shows an embodiment of a radio communication transceiver 1 according to the present invention. Referring to FIG. 1, the radio communication transceiver 1 comprises a transformer 12, a power amplifier (PA) 19, a low noise amplifier (LNA) 20, and a switch 16.

The transformer 12 comprises a primary winding 13 and a center-tap secondary winding 14. The primary winding 13 has a first endpoint 131 and a second endpoint 132. The center-tap secondary winding 14 has a first endpoint 141, a second endpoint 142, and a third endpoint 143.

The switch 16 can be turned ON or OFF corresponding to a control signal (CS) from a host 2. In this embodiment, the switch 16 can be a transistor, such as a Metal-Oxide-Semiconductor Field-Effect Transistor (MOS), comprising a gate (labeled as "G"), a drain (labeled as "D"), and a source (labeled as "S").

The PA 19 has an input terminal and at least one output terminal. The input terminal is connected to an internal circuit 3 of the transceiver 1, for example, connected to an up-conversion module 31. The output terminal is connected to the first endpoint 141 and the second endpoint 142 of the center-tap secondary winding 14 of the transformer 12.

The LNA 20 has an output terminal and an input terminal. The output terminal is connected to the internal circuit 3 of the transceiver 1, for example, connected to a down-conversion module 32. The input terminal is connected to the second endpoint 132 of the primary winding 13 of the transformer 12 through a coupling capacitor 15.

The gate of the switch 16 is connected to the host 2 and is grounded through a bypass capacitor 17, the drain is connected to the input terminal of the LNA 20 and is connected with the coupling capacitor 15, and the source is grounded.

The first endpoint 131 of the primary winding 13 of the transformer 12 is connected to an antenna 11. The third endpoint 143 of the center-tap secondary winding 14 receives a bias signal (PA Bias) from a bias circuit of the PA 19, and is grounded through a bypass capacitor 18.

Figure 2:
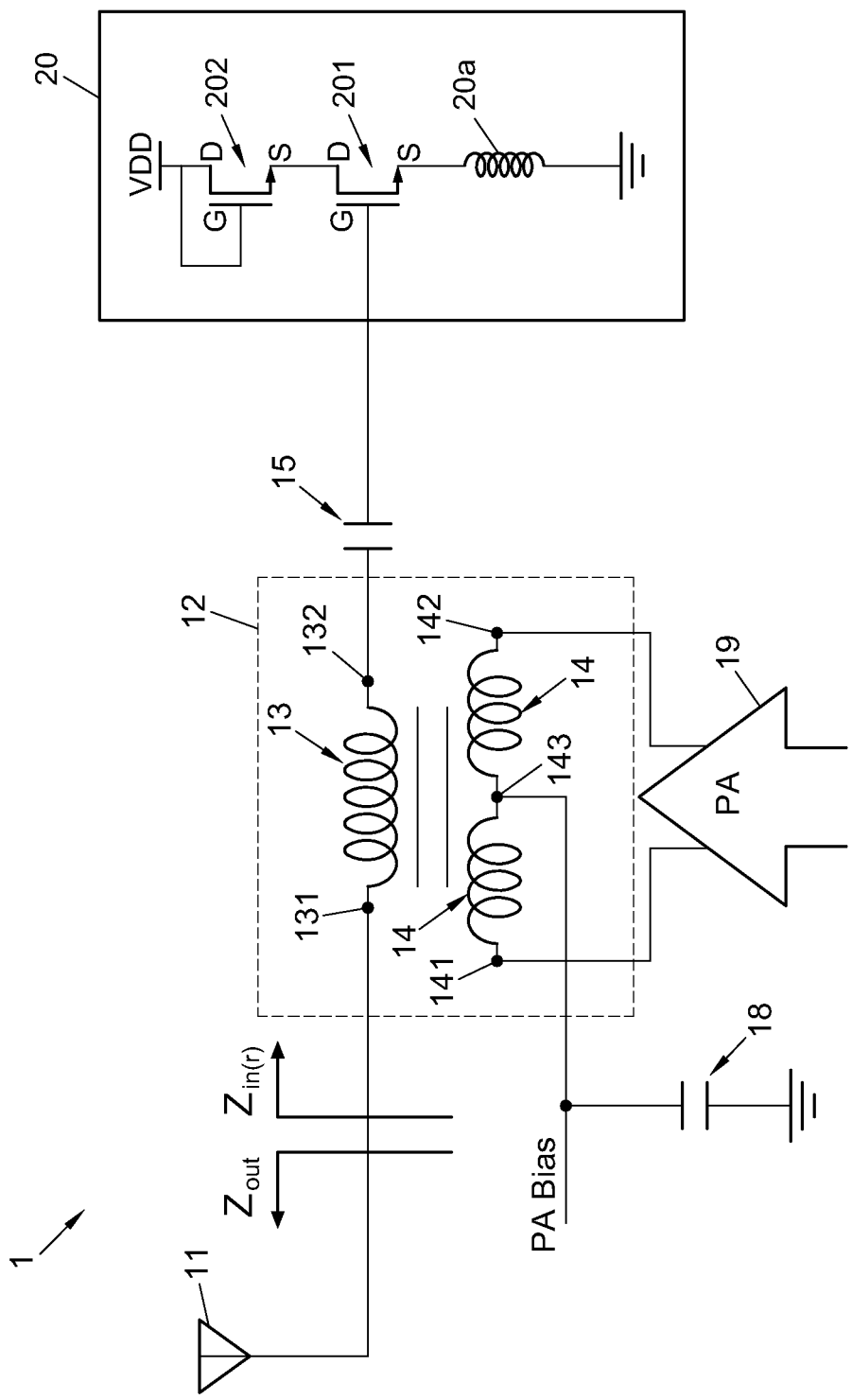
FIG. 2 is a schematic view of a radio communication transceiver 1 operating in a receiving state according to an example of the present invention.

FIG. 2 is a schematic view of the radio communication transceiver 1 operating in a receiving state according to the present invention. Referring to FIG. 2, the LNA 20 further comprises a first transistor 201, a second transistor 202, and an inductor 20a. A gate of the first transistor 201 is connected to the second endpoint 132 of the primary winding 13, and a source of the first transistor 201 is grounded through the inductor 20a. The second transistor 202 is cascaded with the first transistor 201. A source of the second transistor 202 is connected to a drain of the first transistor 201, and a gate and a drain of the second transistor 202 are connected to a power supply $V_{DD}$.

The radio communication transceiver 1 can be operated in a first state, such as a receiving state, and a second state, such as an emitting state. When the radio communication transceiver 1 intends to operate in the receiving state, the switch 16 receives a first potential of the CS from the host 2 and is turned off. A signal received by the antenna 11 is transmitted to the internal circuit 3 through the primary winding 13, the coupling capacitor 15, and the LNA 20.

At this time, input impedance $Z_{in}(r)$ of the radio communication transceiver 1 is total impedance formed by the primary winding 13 and the LNA 20.

Hence, it is assumed that the radio communication transceiver 1 is operated at the input impedance in the receiving state, such that the following equation can be deduced:

$$Z_{in}(r) = s(L_1 + L_s) + \frac{1}{sC_{gs}} + \frac{g_m L_s}{C_{gs}}$$

in which, $C_{gs}$ is gate to source parasitic capacitance of the first transistor 201 of the LNA 20; $L_1$ is the inductor value of the primary winding 13 of the transformer 12; $L_s$ is inductance of the inductor 20a of the LNA 20; $g_m$ is transconductance of the first transistor 201; and $$\frac{g_m L_s}{C_{gs}}$$

is a real part of $Z_{in}(r)$, that is, resistance of the antenna 11.

The foregoing parameters can be mated in the circuit according to actual situations to achieve impedance matching. In an embodiment of the present invention, the following data can be used for reference:

$$f = 2.4 \text{ GHz}$$
$$L_1 = 2.6 \, nH$$
$$\frac{g_m L_s}{C_{gs}} = 50 \, \Omega$$

Figure 3:
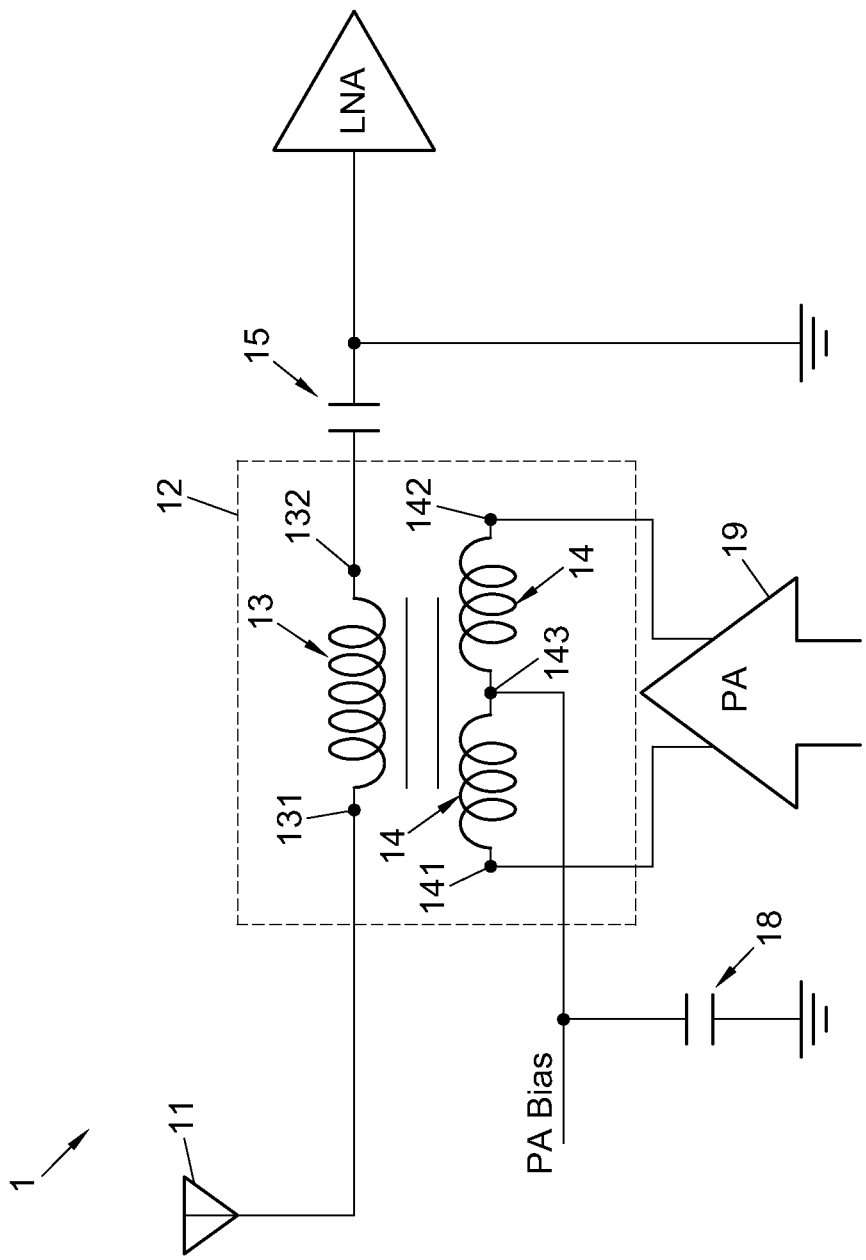
FIG. 3 is a schematic view of a radio communication transceiver 1 operating in an emitting state according to an example of the present invention.

FIG. 3 is a schematic view of the radio communication transceiver 1 operating in an emitting state according to the present invention. Referring to FIG. 3, when the radio communication transceiver 1 intends to operate in the emitting state, the switch 16 receives a second potential of the CS from the host 2 and is turned on, so that the second endpoint 132 of the primary winding 13 is grounded through the coupling capacitor 15. This ground wire can be used to prevent energy from the PA 19 from being transferred to the LNA 20 to damage device. A signal from the PA 19 is transferred to the antenna 11 through the transformer 12. The transformer 12 can be used as a balun transformer. The third endpoint 143 of the center-tap secondary winding 14 is grounded through a bypass capacitor 18, which is mainly used for radio frequency (RF) alternating current (AC) coupling ground, so that potential at an intermediate tap of the transformer 12 approximates to the grounded potential. Because the third endpoint 143 receives a bias signal (for example, Vcc=1.2 volts) from the PA 19, the bypass capacitor 18 is needed to achieve grounding of an AC signal, so as to balance output of the PA 19 and reduce 2nd harmonic distortion.

What is claimed is:

1. A radio communication transceiver, comprising:
a transformer, having a primary winding and a center-tap secondary winding, wherein the primary winding has a first endpoint and a second endpoint, and the center-tap secondary winding has a first endpoint, a second endpoint, and a third endpoint;
a switch, having a gate, a drain, and a source, wherein the gate receives a control signal (CS), the drain is connected to the second endpoint of the primary winding of the transformer through a coupling capacitor, and the source is grounded;
a power amplifier (PA), having at least one output terminal connected to the first endpoint and the second endpoint of the center-tap secondary winding of the transformer, and providing a bias signal to the third endpoint of the center-tap secondary winding; and
a low noise amplifier (LNA), having an input terminal connected to the second endpoint of the primary winding of the transformer;
wherein the switch enables the radio communication transceiver to receive a signal through an antenna and transmit the signal to the LNA corresponding to a first potential of the CS, and enables the signal to be emitted by the antenna through the PA corresponding to a second potential of the CS.

2. The radio communication transceiver according to claim 1, wherein the switch is turned off corresponding to the first potential of the CS.

3. The radio communication transceiver according to claim 1, wherein the gate of the switch is grounded through a bypass capacitor.

4. The radio communication transceiver according to claim 1, wherein the LNA comprises an inductor, a first transistor, and a second transistor, a gate of the first transistor is connected to the second endpoint of the primary winding through the coupling capacitor, a source of the first transistor is grounded through the inductor, and a source of the second transistor is connected to a drain of the first transistor.

5. The radio communication transceiver according to claim 4, wherein the first endpoint of the primary winding of the transformer is connected to the antenna.

6. The radio communication transceiver according to claim 5, wherein impedance of the antenna matches with total impedance formed by impedance of the primary winding of the transformer and impedance of the LNA according to the following equation:

$$Z_{in}(r) = s(L_1 + L_s) + \frac{1}{sC_{gs}} + \frac{g_m L_s}{C_{gs}}$$

in which $Z_{in}(r)$ is the total impedance formed by the primary winding and the LNA, $C_{gs}$ is gate to source parasitic capacitance of the first transistor in the LNA, $L_1$ is the inductor value of the primary winding of the transformer, $L_s$ is inductance of the inductor in the LNA, and $g_m$ is transconductance of the first transistor in the LNA.

7. The radio communication transceiver according to claim 1, wherein an input terminal of the PA is connected to an up-conversion circuit module, and an output terminal of the LNA is connected to a down-conversion circuit module.

8. The radio communication transceiver according to claim 1, wherein the switch is turned on corresponding to the second potential of the CS, so that the second endpoint of the primary winding of the transformer is grounded through the coupling capacitor.

9. The radio communication transceiver according to claim 8, wherein the center-tap secondary winding of the transformer receives a signal from the PA, and the signal is transferred to the antenna to be emitted through the primary winding of the transformer.

10. The radio communication transceiver according to claim 8, wherein the third endpoint of the center-tap secondary winding of the transformer is grounded through a bypass capacitor.

\* \* \* \* \*